US009059015B2

(12) United States Patent
Seo et al.

(10) Patent No.: US 9,059,015 B2
(45) Date of Patent: Jun. 16, 2015

(54) LIGHT EMITTING DEVICE AND METHOD OF FABRICATING THE SAME

(75) Inventors: Won Cheol Seo, Ansan-si (KR); Joon Hee Lee, Ansan-si (KR); Jong Kyun You, Ansan-si (KR); Chang Youn Kim, Ansan-si (KR); Jin Cheul Shin, Ansan-si (KR); Hwa Mok Kim, Ansan-si (KR); Jang Woo Lee, Ansan-si (KR); Yeo Jin Yoon, Ansan-si (KR); Jong Kyu Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/237,778

(22) Filed: Sep. 20, 2011

(65) Prior Publication Data

US 2012/0007109 A1    Jan. 12, 2012

Related U.S. Application Data

(63) Continuation of application No. 13/073,794, filed on Mar. 28, 2011, now Pat. No. 8,648,369, which is a continuation of application No. 12/570,456, filed on Sep. 30, 2009, now Pat. No. 8,288,781.

(30) Foreign Application Priority Data

Sep. 30, 2008  (KR) .................. 10-2008-0095926
Sep. 30, 2008  (KR) .................. 10-2008-0095927

(51) Int. Cl.
*H01L 25/075* (2006.01)
*H01L 27/15* (2006.01)
(Continued)

(52) U.S. Cl.
CPC .......... *H01L 25/0753* (2013.01); *H01L 27/156*
(2013.01); *H01L 33/0079* (2013.01); *H01L 33/46* (2013.01); *H01L 33/62* (2013.01); *H01L 2924/0002* (2013.01)

(58) Field of Classification Search
USPC .................. 257/88, 91, 93; 438/28
See application file for complete search history.

(56) References Cited

U.S. PATENT DOCUMENTS 5,300,788 A    4/1994  Fan et al.
6,236,065 B1 *  5/2001  Kurahashi et al. .............. 257/93
(Continued)

FOREIGN PATENT DOCUMENTS

JP      2004297095      10/2004
JP      2005033197      2/2005
(Continued)

OTHER PUBLICATIONS

Non-Final Office Action of U.S. Appl. No. 13/073,794 issued on Nov. 7, 2011.
(Continued)

*Primary Examiner* — Matthew W Such
*Assistant Examiner* — Robert Carpenter
(74) *Attorney, Agent, or Firm* — H.C. Park & Associates, PLC

(57) ABSTRACT

Disclosed are a light emitting device and a method of fabricating the same. The light emitting device comprises a substrate. A plurality of light emitting cells are disposed on top of the substrate to be spaced apart from one another. Each of the light emitting cells comprises a first upper semiconductor layer, an active layer, and a second lower semiconductor layer. Reflective metal layers are positioned between the substrate and the light emitting cells. The reflective metal layers are prevented from being exposed to the outside.

15 Claims, 9 Drawing Sheets

(51) Int. Cl.
*H01L 33/62* (2010.01)
*H01L 33/00* (2010.01)
*H01L 33/46* (2010.01)

(56) References Cited

U.S. PATENT DOCUMENTS

| | | | |
|---|---|---|---|
| 7,186,580 B2 | 3/2007 | Tran et al. | |
| 7,221,044 B2 * | 5/2007 | Fan et al. | 257/676 |
| 7,279,350 B2 * | 10/2007 | Wu et al. | 438/35 |
| 7,417,259 B2 | 8/2008 | Sakai et al. | |
| 2006/0154392 A1 | 7/2006 | Tran et al. | |
| 2006/0202223 A1 | 9/2006 | Sackrison et al. | |
| 2006/0214173 A1 | 9/2006 | Beeson et al. | |
| 2006/0284195 A1 * | 12/2006 | Nagai | 257/98 |
| 2007/0190676 A1 | 8/2007 | Chu et al. | |
| 2007/0262323 A1 | 11/2007 | Sonobe et al. | |
| 2007/0262333 A1 | 11/2007 | Takeuchi et al. | |
| 2008/0164485 A1 * | 7/2008 | Lee | 257/93 |

FOREIGN PATENT DOCUMENTS

| | | |
|---|---|---|
| JP | 2005322847 | 11/2005 |
| JP | 2006128726 | 5/2006 |
| JP | 2007-134415 | 5/2007 |
| JP | 2007517378 | 6/2007 |
| JP | 2008-053685 | 3/2008 |
| JP | 2008-091664 | 4/2008 |
| JP | 2008-186959 | 8/2008 |
| JP | 2008205005 | 9/2008 |
| KR | 100599012 | 7/2006 |
| WO | 03/065464 | 8/2003 |
| WO | 2004023568 | 3/2004 |
| WO | 2005062389 | 7/2005 |
| WO | 2007/037762 | 4/2007 |

OTHER PUBLICATIONS

Non-Final Office Action issued on Mar. 8, 2012 in U.S. Appl. No. 12/570,456.

Final Office Action of U.S. Appl. No. 13/073,794 issued on Apr. 19, 2012.

Notice of Allowance issued on Jul. 13, 2012 in U.S. Appl. No. 12/570,456.

Notice of Allowance issued on Oct. 16, 2013 in U.S. Appl. No. 13/073,794.

Non-final Office Action issued Oct. 3, 2014 in U.S. Appl. No. 14/229,773.

* cited by examiner

PRIOR ART

US 9,059,015 B2

LIGHT EMITTING DEVICE AND METHOD OF FABRICATING THE SAME

CROSS-REFERENCE TO RELATED APPLICATIONS

This application is a continuation of U.S. patent application Ser. No. 13/073,794, filed on Mar. 28, 2011, now issued as U.S. Pat. No. 8,648,369, which is a continuation of U.S. patent application Ser. No. 12/570,456, filed on Sep. 30, 2009, now issued as U.S. Pat. No. 8,288,781, and claims priority from and the benefit of Korean Patent Application No. 10-2008-0095926, filed on Sep. 30, 2008, and Korean Patent Application No. 10-2008-0095927, filed on Sep. 30, 2008, which are hereby incorporated by reference for all purposes as if fully set forth herein.

BACKGROUND OF THE INVENTION

1. Field of the Invention

Exemplary embodiments of the present invention relate to a light emitting device and a method of fabricating the same, and more particularly, to a light emitting device having a reflective metal layer and a method of fabricating the same.

2. Discussion of the Background

In general, since Group-III-element nitride semiconductors, such as GaN and AlGaN, have excellent thermal stability and a direct-transition-type energy band structure, they have recently come into the spotlight as materials for light emitting devices in blue and ultraviolet regions. Particularly, blue and green light emitting devices using GaInN are used in various applications such as large-sized full-color flat panel displays, backlight sources, traffic lights, indoor illumination, high-density light sources, high-resolution output systems, and optical communications.

Since it is difficult to produce a homogeneous substrate for enabling such a Group-III-element nitride semiconductor to be grown thereon, the nitride semiconductor is grown on a heterogeneous substrate having a crystal structure similar to that of the nitride semiconductor through a process such as metal organic chemical vapor deposition (MOCVD) or molecular beam epitaxy (MBE). A sapphire substrate having a hexagonal system crystal structure is frequently used as the heterogeneous substrate.

Since a sapphire substrate used as the heterogeneous substrate is insulative, a light emitting device having a horizontal structure is fabricated, in which electrode pads are all positioned on top of the substrate, and a p-type GaN layer is positioned in an upper portion of the light emitting device. The p-type GaN layer is formed relatively thin because of its high resistance caused by a limit of epitaxial growth. Transparent electrodes and pads for current spreading are generally formed on the p-type GaN layer. In a large area light emitting device, branch lines extending from pads on a p-type and/or an n-type GaN layers are formed to spread current throughout a wide area. Meanwhile, a reflective metal layer is generally formed on the bottom surface of the sapphire substrate to reflect the light that travels toward the lower portion of the light emitting device.

However, as transparent electrodes and pads, which are employed in a conventional light emitting device, and branch lines extending from the pads are formed on a light emission surface, they absorb the light emitted from an active layer, whereby a light emitting efficiency is decreased. Further, the reflective metal layer is relatively quite distant from the active layer, and hence, a large amount of light may be lost until the light is reflected from the reflective metal layer and emitted to the outside.

Techniques for roughening a light emission surface have been studied to improve a light extraction efficiency. However, a p-type GaN layer cannot be formed thick because of its high resistance, creating a limit in forming a light emission surface to be rough.

Meanwhile, AC light emitting diodes have been commercialized, in which light is continuously emitted by connecting light emitting diodes (LEDs) directly to an AC power source. For example, a light emitting diode capable of being directly connected to a high-voltage AC power source is disclosed in PCT Patent Publication No. WO 2004/023568A1 (SAKAI et al.), entitled "LIGHT-EMITTING DEVICE HAVING LIGHT-EMITTING ELEMENTS."

According to PCT Patent Publication No. WO 2004/023568A1, LEDs are two-dimensionally connected on an insulative substrate such as a sapphire substrate to form LED arrays. Such LED arrays are connected to each other in reverse parallel on the sapphire substrate. As a result, there is provided a single-chip light emitting device capable of being driven by an AC power supply.

Since the AC-LED has light emitting cells formed on a substrate used as a growth substrate, e.g., a sapphire substrate, the light emitting cells have a limitation in structure, and 15 there is a limitation in improving light extraction efficiency. To solve such a problem, a method of fabricating an AC-LED using a substrate separation process is disclosed in Korean Patent Publication No. 10-0599012, entitled "LIGHT EMITTING DIODE HAVING THERMAL CONDUCTIVE SUBSTRATE AND METHOD OF FABRICATING THE SAME."

FIG. 1, FIG. 2, FIG. 3, and FIG. 4 are sectional views illustrating a method of fabricating an AC light emitting device according to a prior art.

Referring to FIG. 1, semiconductor layers comprising a buffer layer 23, an n-type semiconductor layer 25, an active layer 27, and a p-type semiconductor layer 29 are formed on a sacrificial substrate 21. A first metal layer 31 is formed on the semiconductor layers, and a second metal layer 53 is formed on a substrate 51 that is separate from the sacrificial substrate 21. The first metal layer 31 may comprise a reflective metal layer. The second metal layer 53 is joined with the first metal layer 31 so that the substrate 51 is bonded on top of the semiconductor layers.

Referring to FIG. 2, after the substrate 51 is bonded, the sacrificial layer 21 is separated by a laser lift-off process. Also, after the substrate 21 is separated, the remaining buffer layer 23 is removed, and a surface of the n-type semiconductor layer 25 is exposed.

Referring to FIG. 3, the n-type semiconductor layer 25, the active layer 27, the p-type semiconductor layer 29, the first metal layer 31, and the second metal layer 53 are patterned using a photolithography technique so as to form metal patterns 40 spaced apart from one another and light emitting cells 30 positioned on regions of the respective metal patterns 40. Each of the light emitting cells 30 comprises a patterned p-type semiconductor layer 29a, a patterned active layer 27a and a patterned n-type semiconductor layer 25a.

Referring to FIG. 4, metal wires 57 are formed to electrically connect top surfaces of the light emitting cells 30 to the metal patterns 40 adjacent thereto. The metal wires 57 connect the light emitting cells 30, thereby forming a serial array of light emitting cells. Electrode pads 55 for connecting the metal wires 57 may be formed on the n-type semiconductor layers 25a. Electrode pads may also be formed on the metal patterns 40. Two or more arrays may be formed and these arrays are connected in reverse parallel, so that an LED capable of being driven by an AC power source is provided.

According to the prior art, thermal dissipation performance of the LED can be improved since the substrate 51 can be selected from a variety of substrates, and a light extraction efficiency can be enhanced by treating a surface of the n-type semiconductor layer 25a. Further, the first metal layer 31a comprises a reflective metal layer and reflects light traveling from the light emitting cells 30 toward the substrate 51, so that the light emitting efficiency can further improved.

However, in the prior art, while the n-type semiconductor layer 25, the active layer 27, the p-type semiconductor layer 29, the first metal layer 31, and the second metal layer 53 are patterned, etching byproducts of a metallic material stick or adhere to side walls of the light emitting cells 30 and increasing the chances of a short circuit between the n-type semiconductor layer 25a and the p-type semiconductor layer 29. Further, a surface of the first metal layer 31a, which is exposed while the n-type semiconductor layer 25, the active layer 27, and the p-type semiconductor layer 29 are etched, may be easily damaged by plasma. When the first metal layer 31a comprises a reflective metal layer such as Ag or Al, such etching damage may be serious. Since the surface of the metal layer 31a is damaged by plasma, the adhesion of the wires 57 or electrode pads formed on the metal layer 31a is lowered, resulting in a device failure.

Meanwhile, according to the prior art, the first metal layer 31 may comprise a reflective metal layer, thereby reflecting light traveling from the light emitting cells 30 toward the substrate 51. However, it is difficult to expect that light is reflected in spaces between the light emitting cells 30 due to the etching damage or oxidation of the reflective layer. Further, since the substrate 51 is exposed in regions between the metal patterns 40, light may be lost by being absorbed by the substrate 51.

Furthermore, since the wire 57 is connected to a top surface of the n-type semiconductor layer 25a, i.e., a light emission surface, the light emitted from the active layer 25a is absorbed by the wire 57 and/or the electrode pad 55, thereby also resulting in light loss.

SUMMARY OF THE INVENTION

Exemplary embodiments of the present invention provide a light emitting device, in which a short circuit in a light emitting cell due to metallic etch byproducts can be prevented, and a method of fabricating the light emitting device.

Exemplary embodiments of the present invention also provide a light emitting device, in which loss of light traveling toward a substrate from spaces between light emitting cells can be reduced, and a method of fabricating the light emitting device.

Exemplary embodiments of the present invention also provide a light emitting device, wherein light emitting efficiency can be improved by reducing loss of light emitted from a light emission surface, and a method of fabricating the light emitting device.

Exemplary embodiments of the present invention also provide a light emitting device, in which a reflective metal layer can be prevented from being deformed due to etching or oxidation, and a method of fabricating the light emitting device.

Exemplary embodiments of the present invention also provide a light emitting device, in which a light emitting efficiency can be improved by omitting transparent electrodes and pads to be formed on a light emission surface, and a method of fabricating the light emitting device.

Exemplary embodiments of the present invention also provide a light emitting device, wherein light loss can be prevented by reducing a reflection path of light, and a method of fabricating the light emitting device.

Exemplary embodiments of the present invention also provide a light emitting device, which can be used as a large area device, and a method of fabricating the light emitting device.

Exemplary embodiments of the present invention also provide a light emitting device, wherein a nitride semiconductor layer in a light emission surface side is relatively thicker than a nitride semiconductor layer in a substrate side, and a method of fabricating the light emitting device.

Additional features of the invention will be set forth in the description which follows, and in part will be apparent from the description, or may be learned by practice of the invention.

An exemplary embodiment of the present invention discloses a light emitting device comprising a substrate; a plurality of light emitting cells spaced apart from one another and disposed on the substrate, each light emitting cell comprising a first upper semiconductor layer, an active layer, and a second lower semiconductor layer, the active layer and the second lower semiconductor layer being disposed under a partial region of the first upper semiconductor layer; wires disposed between the substrate and the light emitting cells, the wires connecting the light emitting cells to form a serial array of the light emitting cells; an intermediate insulating layer disposed between the light emitting cells and the substrate to cover the light emitting cells and the wires; and first reflective metal layers disposed between the intermediate insulating layer and the light emitting cells.

An exemplary embodiment of the present invention also discloses a method of fabricating a light emitting device comprising forming compound semiconductor layers on a sacrificial substrate, the compound semiconductor layers comprising a first semiconductor layer, a second semiconductor layer, and an active layer disposed between the first semiconductor layer and the second semiconductor layer, the first semiconductor layer being disposed on the sacrificial substrate; patterning the compound semiconductor layers to form a plurality of mesas so that the first semiconductor layer is exposed around the mesas; disposing first reflective metal layers on the mesas; disposing an insulating layer covering the mesas and the exposed first semiconductor layer, the insulating layer comprising openings exposing upper portions of the mesas and openings exposing the first semiconductor layer between the mesas; disposing wires to electrically connect the mesas to the exposed first semiconductor layers adjacent thereto; disposing an intermediate insulating layer on the sacrificial substrate having the wires formed thereon; bonding a substrate to a top of the intermediate insulating layer; removing the sacrificial substrate so that the first semiconductor layer is exposed; and separating the exposed first semiconductor layer to form a plurality of light emitting cells spaced apart from one another, wherein the first semiconductor layer is separated so that the plurality of light emitting cells are connected in series by the wires.

An exemplary embodiment of the present invention also discloses a light emitting device comprising a substrate; a plurality of light emitting cells disposed on the substrate, each light emitting cell comprising a first upper semiconductor layer, an active layer, and a second lower semiconductor layer; a first connection metal disposed between the substrate and the light emitting cells, the first connection metal being insulated from the active layers and the first upper semiconductor layers, the first connection metal electrically connecting the second lower semiconductor layers; reflective metal layers interposed between the second lower semiconductor layers and the first connection metal to electrically connect the second lower semiconductor layers; a first electrode pad spaced apart from light emission surfaces of the light emitting cells, wherein the first electrode pad is electrically connected to the upper semiconductor layers; and a second electrode pad spaced apart from light emission surfaces of the light emitting cells, wherein the second electrode pad is electrically connected to the first connection metal, wherein each of the first upper semiconductor layers comprises an extension extending from a region of the light emitting cell.

An exemplary embodiment of the present invention also discloses a method of fabricating a light emitting device comprising disposing compound semiconductor layers on a sacrificial substrate, the sacrificial substrate comprising a plurality of light emitting cell regions, a first electrode pad region, and a second electrode pad region, the compound semiconductor layers comprising a first semiconductor layer, a second semiconductor layer, and an active layer disposed between the first semiconductor layer and the second semiconductor layer, the first semiconductor layer disposed on the sacrificial substrate; patterning the compound semiconductor layers to form a plurality of light emitting cells on the light emitting cell regions so that the first semiconductor layer is exposed on the first electrode pad region, on the second electrode pad region, and around the light emitting cells; disposing reflective metal layers on the light emitting cells; disposing a first insulating layer to cover the light emitting cells and the exposed first semiconductor layer, wherein the first insulating layer comprises openings exposing the reflective metal layers and an opening exposing the first semiconductor layer on the second electrode pad region; disposing a first connection metal to electrically connect the second semiconductor layers by covering the first insulating layer and the reflective metal layers, wherein the first connection metal is electrically connected to the first semiconductor layer on the second electrode pad region; bonding a substrate to the first connection metal; removing the sacrificial substrate so that the first semiconductor layer is exposed; and patterning the exposed the first semiconductor layer to separate the first semiconductor layer on the second electrode pad region from the light emitting cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
FIG. 1, FIG. 2, FIG. 3, and FIG. 4 are sectional views illustrating a method of fabricating an AC light emitting device according to a prior art.
Figure 1:
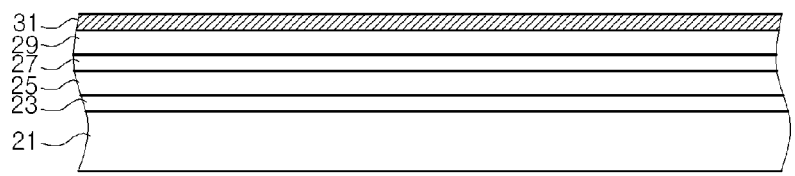
Figure 2:
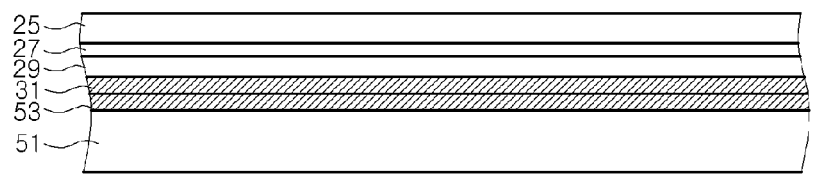
Figure 3:
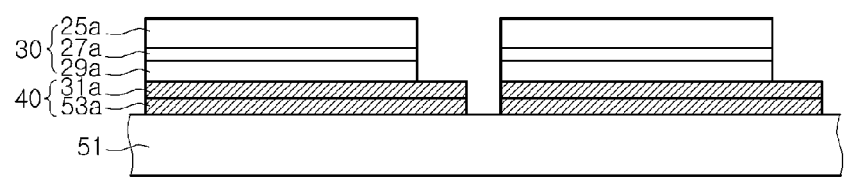
Figure 4:
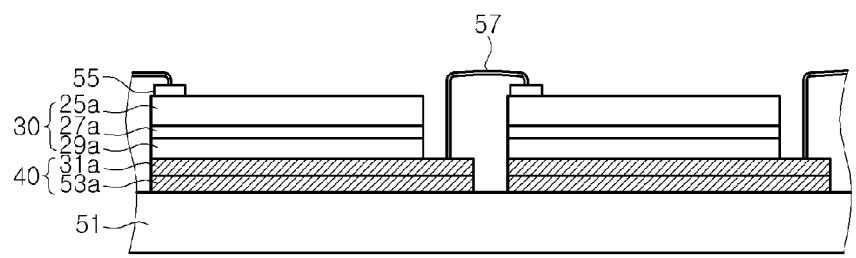

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 5:
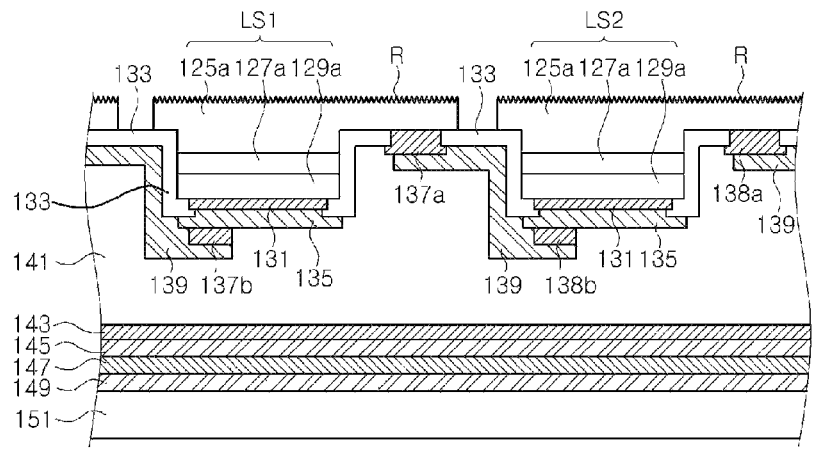
FIG. 5 is a sectional view of an AC light emitting device according to an exemplary embodiment of the present invention.

FIG. 5 is a sectional view of an AC light emitting device according to an exemplary embodiment of the present invention.

Referring to FIG. 5, the light emitting device comprises a substrate 151, a plurality of light emitting cells LS1 and LS2, wires 139, first reflective metal layers 131 and an intermediate insulating layer 141, and may further comprise an insulating layer 133, protective metal layers 135, first electrode pads 137a and 138a, second electrode pads 137b and 138b, a second reflective metal layer 143, a protective metal layer 145, a first bonding metal 147, and a second bonding metal 149.

The substrate 151 is differentiated from a growth substrate for growing compound semiconductor layers thereon and is a bonding substrate bonded to compound semiconductor layers, which have been previously grown. The bonding substrate 151 may be a sapphire substrate, but it is not limited thereto. That is, the bonding substrate 151 may be another kind of insulative or conductive substrate. Particularly, when a sapphire substrate is used as the growth substrate, the bonding substrate 151 has the same thermal expansion coefficient as that of the growth substrate. Hence, the substrate 151 is preferably a sapphire substrate.

The plurality of light emitting cells LS1 and LS2 are positioned over the substrate 151 to be spaced apart from each other. Each of the light emitting cells LS1 and LS2 comprises a first upper semiconductor layer 125a, a patterned active layer 127a and a second lower semiconductor layer 129a. The patterned active layer 127a is interposed between the first upper semiconductor layer 125a and the second lower semiconductor layer 129a. Meanwhile, the patterned active layer 127a and the second lower semiconductor layer 129a are formed under a partial region of the first upper semiconductor layer 125a. That is, the first upper semiconductor layer 125a is wider than that of each of the patterned active layer 127a and the second lower semiconductor layer 129a.

The patterned active layer 127a and the first upper semiconductor layer 125a and the second lower semiconductor layer 129a may be formed of a III-N compound semiconductor, e.g., an (Al, Ga, In)N semiconductor. Each of the upper first semiconductor layer 125a and the second lower semiconductor layer 129a may be formed to have a single- or multi-layered structure. For example, the first upper semiconductor layer 125a and/or the second lower semiconductor layer 129a may comprise contact and clad layers and also comprise a superlattice layer. The patterned active layer 127a may be formed to have a single or multiple quantum well structure. Preferably, the first conductive type is an n-type, and the second conductive type is a p-type. The first upper semiconductor layers 125a can be formed of an n-type semiconductor layer having relatively low resistance, so that the thickness of the first upper semiconductor layers 125a can be formed to be relatively thick. Accordingly, it is easy to form a rough surface R on a top surface of the first upper semiconductor layer 125a, and the rough surface R enhances an extraction efficiency of light generated from the patterned active layer 127a.

The wires 139 electrically connect the light emitting cells LS1 and LS2, thereby forming a serial array. As shown in this figure, the wires 139 are positioned between the substrate 151 and the light emitting cells LS1 and LS2 and electrically connect the first upper semiconductor layer 125a and the second lower semiconductor layer 129a of adjacent light emitting cells LS1 and LS2 to each other. In order to connect the wires 139 to the first upper semiconductor layer 125a and the second lower semiconductor layer 129a, the first electrode pads 137a and 138a and the second electrode pads 137b and 138b may be formed on the first upper semiconductor layer 125a and the second lower semiconductor layer 129a.

At least two serial arrays may be formed on top of the substrate 151 by the wires 139. Accordingly, these arrays may be connected to each other in reverse parallel, thereby being driven by an AC power source. Alternatively, a serial array may be formed on the substrate 151 by the wires 139 and connected to a bridge rectifier formed on the substrate 151. Accordingly, the serial array can be driven by an AC power source. The bridge rectifier may also be formed by connecting the light emitting cells LS1 and LS2 through wires 139.

The insulating layer 133 covers sides of the light emitting cells LS1 and LS2 to prevent the wires 139 from coming into contact with semiconductor layers that are exposed on the sides of the light emitting cells. The insulating layer 133 has openings for exposing bottom surfaces of the first upper semiconductor layers 125a, and also has openings under the second lower semiconductor layers 129a. The insulating layer 133 allows the wires 139 to be insulated from the patterned active layers 127a and the first upper semiconductor layers 125a that are exposed at the sides of the light emitting cells. The wires 139 are electrically connected to the bottom surfaces of the first upper semiconductor layers 125a and the second lower semiconductor layers 129a through the openings in the insulating layer 133. The insulating layer 133 prevents the wires 139 from being exposed in regions in which the light emitting cells LS1 and LS2 are separated from each other.

The intermediate insulating layer 141 is interposed between the substrate 151 and the light emitting cells LS1 and LS2. The intermediate insulating layer 141 covers the light emitting cells LS1 and LS2 and the wires 139 thereunder. The intermediate insulating layer 141 prevents the light emitting cells LS1 and LS2 from being short-circuited to each other by the substrate 151 or the first bonding metal 147 or the second bonding metal 149.

The first reflective metal layers 131 is interposed between the intermediate insulating layer 141 and the respective light emitting cells LS1 and LS2. The first reflective metal layers 131 reflect the light that is generated from the patterned active layers 127a and travels toward substrate 151, thereby improving light emitting efficiency. The first reflective metal layers 131 may be formed of a metallic material having high reflexibility, e.g., Ag, Al, or alloy thereof. In addition, an ohmic contact layer (not shown) may be interposed between the first reflective metal layers 131 and the second lower semiconductor layers 129a.

In order to protect the first reflective metal layers 131, the protective metal layers 135 may cover the first reflective metal layers 131 thereunder. The protective metal layers 135 prevent a metallic material from spread and the first reflective metal layer 131 from being exposed to the outside.

The first electrodes pads 137a and 138a are formed on the lower surfaces of the first upper semiconductor layers 125a of the light emitting cells LS1 and LS2. The first electrodes pads may be formed on the first upper semiconductor layers 125a through the openings in the insulating layer 133. An ohmic contact layer (not shown) may be interposed between the first electrode pads 137a and 138a and the first upper semiconductor layers 125a. On the other hand, the second electrode pads 137b and 138b are formed on the lower surfaces of the second lower semiconductor layers 129a of the light emitting cells LS1 and LS2. The second electrode pads 137b and 138b may be formed on the first reflective metal layers 131 or the protective metal layers 135. The wires 139 are connected to the first electrode pads 137a and 138a and the second electrode pads 137b and 138b to thereby electrically connect the light emitting cells. The first electrode pads 137a and 138a and/or second electrode pads 137b and 138b may be omitted.

The second reflective metal layer 143 is interposed between the intermediate insulating layer 141 and the substrate 151. The second reflective metal layer 143 may be formed over the almost entire surface of the substrate 151. Generally, the wires 139 are formed in a line shape, and a considerably large amount of light travels toward the substrate 151 from a space between the light emitting cells LS1 and LS2. Such light may be absorbed by the first bonding metal 147 and the second bonding metal 149, resulting in light loss. The second reflective metal layer 143 reflects light traveling toward the substrate 151 from the space between the light emitting cells LS1 and LS2, thereby reducing or preventing light loss.

In addition, the protective metal layer 145 may be formed to protect the second reflective metal layer 143. The protective metal layers 135 and the protective metal layer 145 may be formed to have a single- or multi-layered structure. For example, the protective metal layers 135 and the protective metal layer 145 may be formed of Ni, Ti, Ta, Pt, W, Cr, Pd or the like.

The first bonding metal 147 and the second bonding metal 149 are interposed between the substrate 151 and the intermediate insulating layer 141 to bond the substrate 151 to the intermediate insulating layer 141. The first bonding metal 147 and the second bonding metal 149 enhance the adhesion between the intermediate insulating layer 141 and the bonding substrate 151, thereby preventing the bonding substrate 151 from being separated from the intermediate insulating layer 141.

FIG. 6, FIG. 7, FIG. 8, FIG. 9, FIG. 10, FIG. 11, FIG. 12, and FIG. 13 are sectional views illustrating a method of fabricating an AC light emitting device according to an exemplary embodiment of the present invention.

Figure 6:
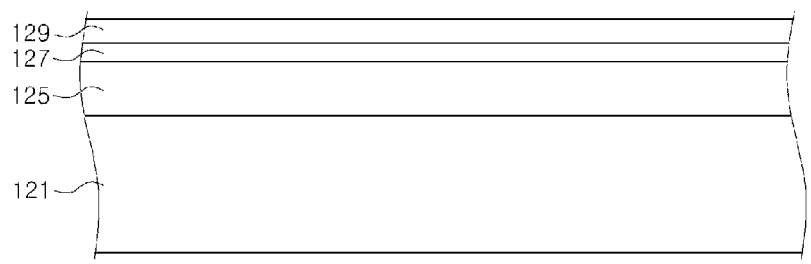
FIG. 6, FIG. 7, FIG. 8, FIG. 9, FIG. 10, FIG. 11, FIG. 12, and FIG. 13 are sectional views illustrating a method of fabricating an AC light emitting device according to an exemplary embodiment of the present invention.

Referring to FIG. 6, compound semiconductor layers are formed on a sacrificial substrate 121. The sacrificial substrate 121 may be a sapphire substrate, but it is not limited thereto. That is, the sacrificial substrate may be a heterogeneous substrate. In the meantime, the compound semiconductor layers comprise a first semiconductor layer 125, a second semiconductor layer 129, and an active layer 127 interposed therebetween. The first semiconductor layer 125 is positioned close to the sacrificial substrate 121. Each of the first semiconductor layer 125 and the second semiconductor layer 129 may be formed to have a single- or multi-layered structure. Also, the active layer 127 may be formed to have a single or multiple quantum well structure.

The compound semiconductor layers may be formed of a III-N compound semiconductor and grown on the sacrificial substrate 121 through a process such as metal organic chemical vapor deposition (MOCVD) or molecular beam epitaxy (MBE).

Meanwhile, before the compound semiconductor layers are formed, a buffer layer (not shown) may be formed. The buffer layer may be employed to reduce lattice mismatch between the sacrificial substrate 121 and the compound semiconductor layers. The buffer layer may be a layer formed of a GaN-based material such as GaN or AN.

Figure 7:
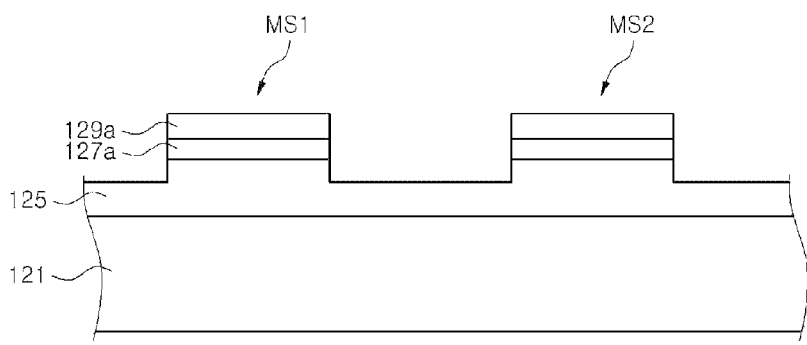

Referring to FIG. 7, a plurality of mesas MS1 and MS2 are formed by patterning the compound semiconductor layers. Each of the mesas MS1 and MS2 comprises a patterned active layer 127a and a patterned second lower semiconductor layer 129a, and may comprise a portion of the first semiconductor layer 125 due to over-etching. The compound semiconductor layers may be patterned using a photolithography process, and such a process is generally known as a mesa etching process. At this time, the second semiconductor layer 129 and the active layer 127 around each mesa are removed, and the first semiconductor layer 125 is exposed. As shown in this figure, the first semiconductor layer 125 may be partially etched and removed. As a result, the first semiconductor layer 125, the patterned active layers 127a, and the second lower semiconductor layers 129a are exposed at the sides of the mesas MS1 and MS2.

Figure 8:
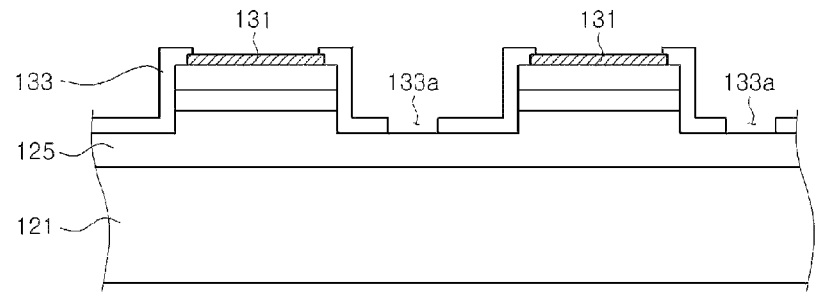

Referring to FIG. 8, first reflective metal layers 131 are formed on the mesas MS1 and MS2, respectively. The first reflective metal layers 131 may be formed of Ag, Al, Ag alloy or Al alloy, for example. The first reflective metal layers 131 may be formed using a plating or depositing technique, for example, a lift-off process. When the first reflective metal layer 131 is not in ohmic contact with the second semiconductor layer 129, an ohmic contact layer (not shown) may be formed before the first reflective metal layer 131 is formed.

Subsequently, an insulating layer 133 is formed to cover the mesas MS1 and MS2 and the exposed first semiconductor layer 125. The insulating layer 133 may be formed of $SiO_2$, SiN, MgO, TaO, $TiO_2$, or polymer, for example. The insulating layer 133 may cover the first semiconductor layer 125 and the patterned active layers 127a, which are exposed at the sides of the mesas and may also cover the second lower semiconductor layers 129a. The insulating layer 133 is patterned to have openings for exposing the first reflective metal layers 131 and openings 133a for exposing the first semiconductor layer 125.

Although it has been described that the first reflective metal layer 131 is formed before forming the insulating layer 133, the first reflective metal layer 131 may be formed after forming the insulating layer 133.

Figure 9:
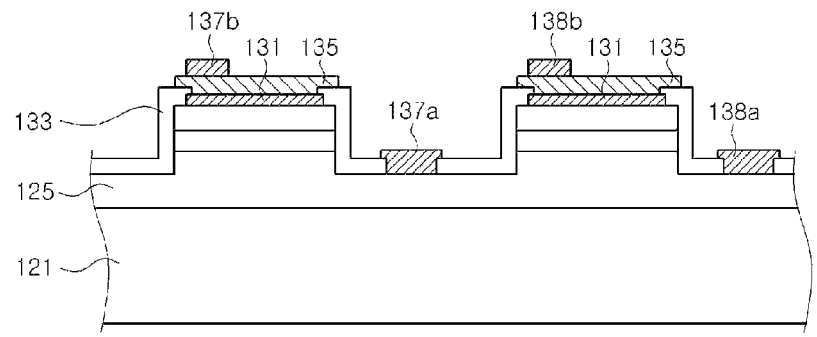

Referring to FIG. 9, protective metal layers 135 are formed to cover the first reflective metal layers 131, respectively. The protective metal layer 135 may cover the first reflective metal layer 131 by covering the opening of the insulating layer 133. For example, the protective metal layer 135 may be formed of Ni, Ti, Ta, Pt, W, Cr, Pd, or the like.

Meanwhile, first electrode pads 137a and 138a are formed on the first semiconductor layer 125 exposed through openings 133a, and second electrode pads 137b and 138b are formed on the protective metal layers 135. Before forming the first electrode pads 137a and 138a, an ohmic metal layer may be further formed. When the protective metal layers 135 are omitted, the second electrode pads 137b and 138b may be formed on the first reflective metal layers 131. The first electrode pads 137a and 138a and the second electrode pads 137b and 138b are to enhance the adhesion of wires, and may be omitted.

Figure 10:
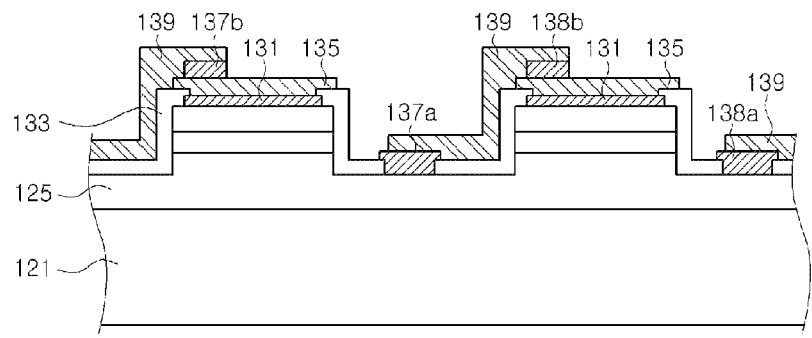

Referring to FIG. 10, subsequently, wires 139 are formed to connect the first electrode pads 137a and 138a to the second electrode pads 137b and 138b, respectively. For example, the wire 139 connects the first electrode pad 137a in the vicinity of the mesa MS1 to the second electrode pad 138b on the mesa MS2. In such a manner, the wire 139 electrically connects the first semiconductor layer 125 between the mesas to the second lower semiconductor layer 129a of one of the mesas adjacent to the first semiconductor layer 125.

Figure 11:
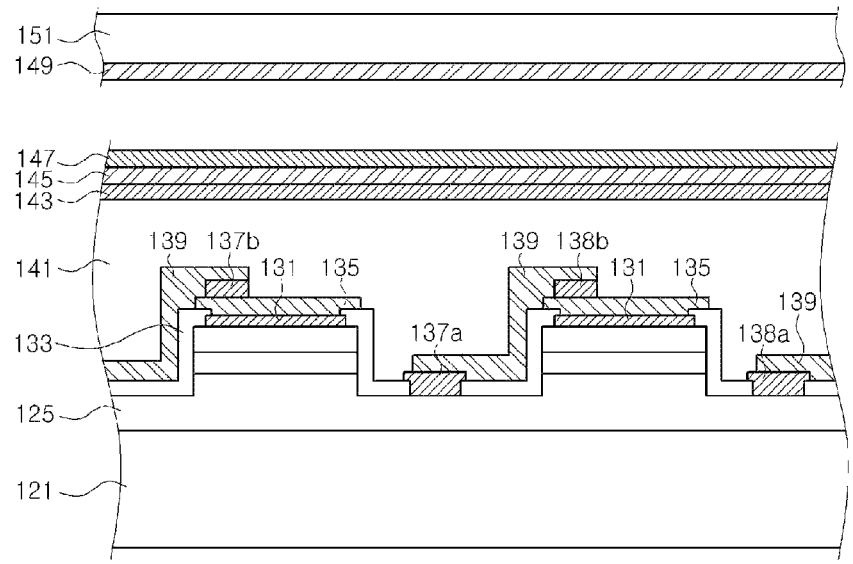

Referring to FIG. 11, an intermediate insulating layer 141 is formed on almost the entire surface of the sacrificial substrate 121 formed with the wires 139. The intermediate insulating layer 141 covers upper portions of the mesas MS1 and MS2 and the wires 139. Subsequently, a second reflective metal layer 143 is formed on the intermediate insulating layer 141 and a protective metal layer 145 is formed to cover the second reflective metal layer 143.

The second reflective metal layer 143 may be formed of Ag, Al, Ag alloy, or Al alloy, for example. The protective metal layer 145 prevents a metallic material from being spread and the second reflective metal layer 143 from being deformed. The protective metal layer 145 may be formed to have a single- or multi-layered structure. For example, the protective metal layer 145 may be formed of Ni, Ti, Ta, Pt, W, Cr, Pd, or the like.

Meanwhile, a first bonding metal 147 is formed on the protective metal layer 145, and a second bonding metal 149 is formed on an additional substrate 151. The first bonding metal 147 may be formed of AuSn (80/20 wt %), for example. The substrate 151 is not particularly limited but may be a substrate, e.g., a sapphire substrate, which has a thermal expansion coefficient identical to that of the sacrificial substrate 121.

Figure 12:
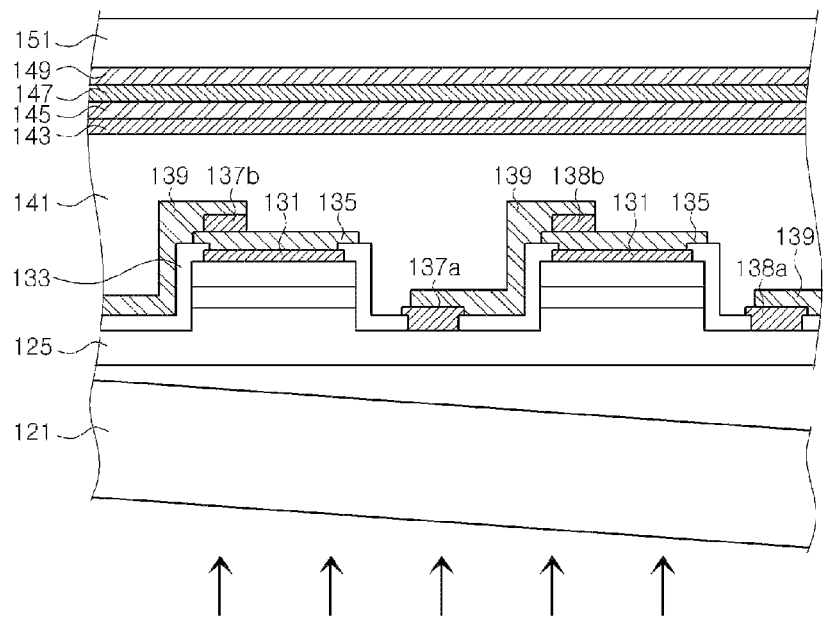
Figure 13:
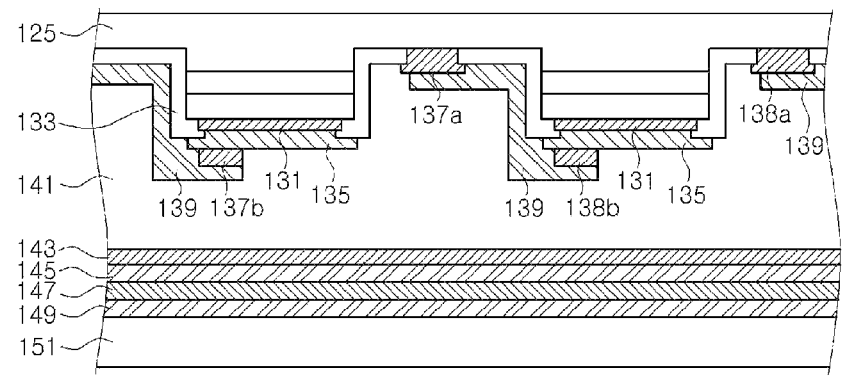

Referring to FIG. 12, the first bonding metal 147 and the second bonding metal 149 are bonded to face each other, so that the substrate 151 is bonded to the intermediate insulating layer 141. Subsequently, the sacrificial substrate 121 is removed, leaving the first semiconductor layer 125 is exposed. The sacrificial substrate 121 may be separated using a laser lift-off (LLO) technique or other mechanical or chemical methods. At this time, any buffer layer (not shown) is also removed so that the first semiconductor layer 125 is exposed. FIG. 13 shows that the light emitting device is turned over so that the first semiconductor layer 125 faces upward after the sacrificial substrate 121 is removed.

Referring back to FIG. 5, the exposed first semiconductor layer 125 is separated so that the light emitting cells LS1 and LS2 are spaced apart from each other. The first semiconductor layer 125 may be separated using a photolithography process. At this time, the insulating layer 133 may be exposed at the separation regions. The insulating layer 133 prevents the wires 139 from being exposed. The first semiconductor layer 125 is separated so that the light emitting cells are connected to each other in series by the wires 139. That is, first upper semiconductor layers 125a of adjacent light emitting cells are separated from each other between the first electrode pads 137a and 138a and the second electrode pads 137b and 138b connected by the wire 139.

Meanwhile, rough surfaces R may be formed on the first upper semiconductor layers 125a of the light emitting cells LS1 and LS2 using a photoelectrochemical (PEC) etching process or the like. Thereafter, the substrate 151 is separated into AC light emitting devices each having a plurality of light emitting cells LS1 and LS2, and thus, a single-chip AC light emitting device is completed.

Up to the present, an AC light emitting device having a plurality of light emitting cells connected in series and a method of fabricating the same have been illustrated. However, the present invention is not limited to an AC light emitting device, but may provide a light emitting device having a plurality of light emitting cells connected in series, which can be used by being connected to a DC power source. Meanwhile, a light emitting device having a plurality of light emitting cells connected in parallel will be described below.

Figure 14:
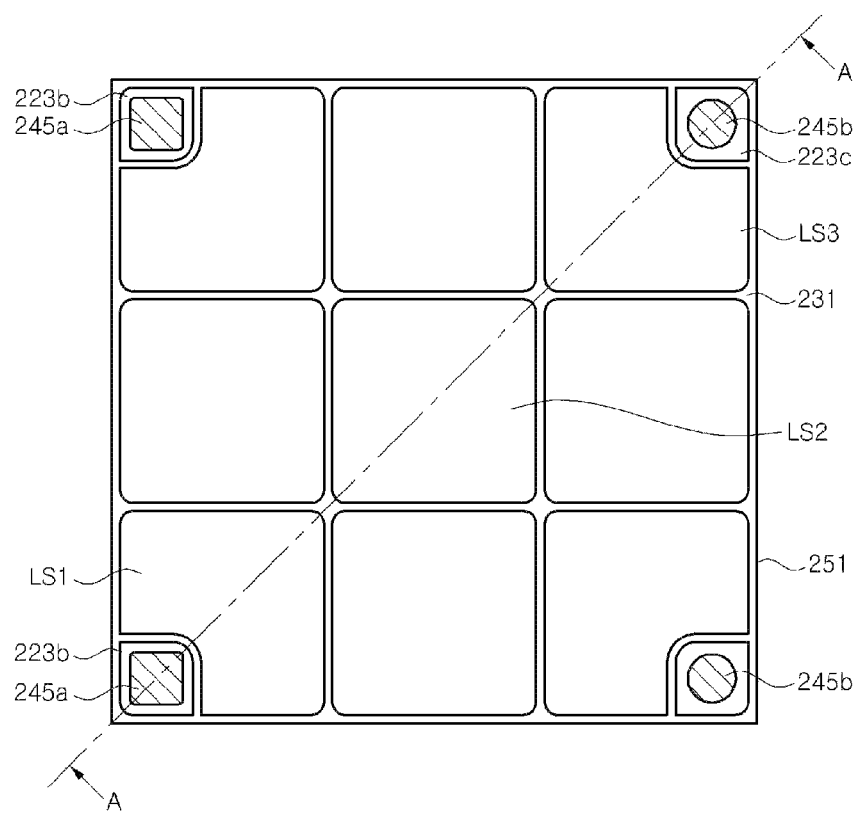
FIG. 14 is a plan view illustrating a light emitting device according to an exemplary embodiment of the present invention.
Figure 15:
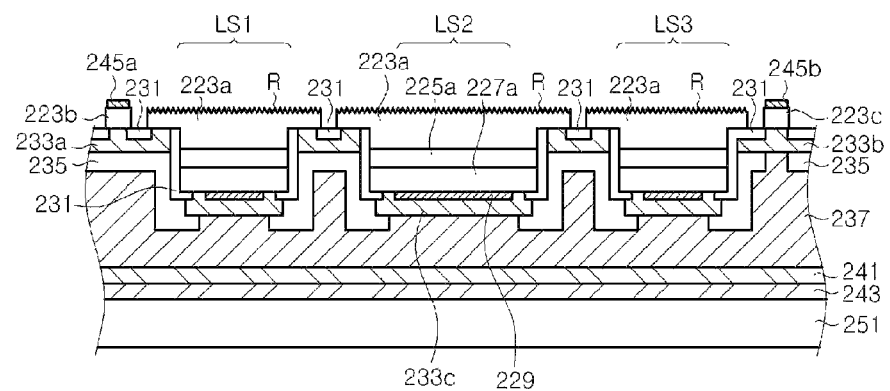
FIG. 15 is a sectional view taken along line A-A of FIG. 14.

FIG. 14 is a plan view illustrating a light emitting device having a plurality of light emitting cells connected in parallel according to an exemplary embodiment of the present invention, and FIG. 15 is a sectional view taken along line A-A of FIG. 14.

Referring to FIG. 14 and FIG. 15, the light emitting device comprises a substrate 251, a plurality of light emitting cells LS1, LS2, LS3 and the like, a connection metal 237, reflective metal layers 229, a first electrode pad 245a, and a second electrode pad 245b. The light emitting device may further comprise first insulating layers 231, second insulating layers 235, a protective metal layer 233c, connection metals 233a, an intermediate metal 233b, a first bonding metal 241, and a second bonding metal 243.

The substrate 251 is differentiated from a growth substrate for growing compound semiconductor layers thereon and is a bonding substrate bonded to compound semiconductor layers which have been previously grown. The bonding substrate 251 may be a sapphire substrate, but it is not limited thereto. That is, the bonding substrate 251 may be another kind of insulative or conductive substrate.

The plurality of light emitting cells LS1, LS2, LS3 and the like are positioned on top of the substrate 251. Each of the light emitting cells LS1, LS2, LS3 and the like comprises a first upper semiconductor layer 223a, a patterned active layer 225a, and a second lower semiconductor layer 227a. The patterned active layer 225a is interposed between the first upper semiconductor layer 223a and the second lower semiconductor layer 227a. Meanwhile, the patterned active layer 225a, first upper semiconductor layer 223a, and the second lower semiconductor layer 227a may be formed of a III-N compound semiconductor, e.g., an (Al, Ga, In)N semiconductor. Each of the first upper semiconductor layers 223a and the second lower semiconductor layers 227a may be formed to have a single- or multi-layered structure. For example, the first upper semiconductor layer 223a and/or the second lower semiconductor layer 227a may comprise contact and clad layers and also comprise a superlattice layer. The patterned active layer 225a may be formed to have a single or multiple quantum well structure. Preferably, the first upper semiconductor layer 223a is an n-type, and the second lower semiconductor layer 227a is a p-type. The first upper semiconductor layers 223a are formed of an n-type semiconductor layer having relatively low resistance, so that the thickness of the first upper semiconductor layers 223a can be formed relatively thick. Accordingly, it is easy to form a rough surface R on a top surface of the first upper semiconductor layer 223a, and the rough surface R improves an extraction efficiency of light generated from the patterned active layer 225a.

The first upper semiconductor layers 223a are wider than regions of the light emitting cells LS1, LS2, LS3 and the like, i.e., regions of the patterned active layers 225a. That is, the first upper semiconductor layers 223a have extensions around the light emitting cells LS1, LS2, LS3 and the like, respectively. The extensions are used to electrically connect the first upper semiconductor layers 223a. The extensions may be connected to one another to be continuous. However, the extensions are preferably separated from one another as illustrated in these figures.

The connection metal 237 is positioned between the substrate 251 and the light emitting cells LS1, LS2, LS3 and the like to thereby electrically connect the second lower semiconductor layers 227a to one another. In the meantime, the connection metal 237 is insulated from the patterned active layers 225a and the first upper semiconductor layers 223a by the first insulating layer 231 and/or the second insulating layer 235. The connection metal 237 may be formed relatively thick to have a flat bottom surface. The connection metal 237 may be formed to have a single- or multi-layered structure. For example, the connection metal 237 may be formed of Ni, Ti, Ta, Pt, W, Cr, Pd, or the like. The first bonding metal 241 and the second bonding metal 243 are interposed between the connection metal 237 and the substrate 251. The substrate 251 is bonded to the connection metal 237 by the first bonding metal 241 and the second bonding metal 243.

Meanwhile, the reflective metal layers 229 may be interposed between the connection metal 237 and the second lower semiconductor layer 227a. The reflective metal layers 229 may be formed of a metallic material having high reflexibility, e.g., Ag, Al, or alloy thereof. Preferably, the reflective metal layer 229 is formed on a partial region of the bottom surface of the second lower semiconductor layer 227a. In addition, an ohmic contact layer (not shown) may be interposed between the reflective metal layer 229 and the second lower semiconductor layer 227a.

The protective metal layers 233c may be interposed between the reflective metal layers 229 and the connection metal 237. The protective metal layer 233c covers the reflective metal layer 229 so as to prevent a metallic material from being spread and the reflective metal layer 229 from being exposed to the outside. The connection metal 237 may serve as the protective metal layers 233c. In this case, the protective metal layers 233c may be omitted. The connection metal 237 may comprise a reflective metal layer. In this case, the reflective metal layers 229 may be omitted.

The first electrode pad 245a is disposed to be spaced apart from light emission surfaces of the light emitting cells LS1, LS2, LS3 and the like. The first electrode pad 245a is electrically connected to the first upper semiconductor layers 223a. For example, when the first upper semiconductor layers 223a of the light emitting cells are continuous with one another, the first electrode pad 245a is formed at an edge of the first upper semiconductor layers 223a, thereby being electrically connected to the first upper semiconductor layers 223a. When the first upper semiconductor layers 223a are separated from one another, they are electrically connected to one another by the connection metal 237, and the first electrode pad 245a is connected to the connection metal 237, thereby being electrically connected to the first upper semiconductor layers 223a. Further, a first separated layer 223b of a first semiconductor is positioned to be spaced apart from the first upper semiconductor layers 223a, and the first electrode pad 245a may be formed on the first separated layer 223b. The first separated layer 223b is electrically connected to the first upper semiconductor layer 223a through the connection metal 233a.

Meanwhile, the second electrode pad 245b is spaced apart from the light emitting cells LS1, LS2, LS3 and the like and electrically connected to the connection metal 237 for connecting the second lower semiconductor layers 227a. Although the second electrode pad 245b may be directly disposed on the connection metal 237, it may be formed on a second separated layer 223c as shown in this figure. The second electrode pad 245b may be electrically connected to the connection metal 237 through the intermediate metal 233b.

The first separated layer 223b and the second separated layer 223c are formed of a first semiconductor having the same material type as that of the first upper semiconductor layer 223a. The first separated layer 223b and the second separated layer 223c may be positioned to be spaced apart from the light emitting cells LS1, LS2, LS3 and the like. Preferably, the first separated layer 223b and the second separated layer 223c are positioned at an edge or corner of the light emitting device. A plurality of first separated layers 223b and second separated layers 223c may be disposed.

The first separated layer 223b and the second separated layer 223c may be formed by being grown together with the first upper semiconductor layers 223a and then separated from the first upper semiconductor layers 223a. Thus, the first separated layer 223b and the second separated layer 223c may be positioned flush with the first upper semiconductor layers 223a and formed of the same material as that of the first upper semiconductor layers 223a.

The connection metals 233a connect the first separated layer 223b to the extension of the first upper semiconductor layer 223a of the light emitting cell LS1, and connect adjacent ones of the first upper semiconductor layers 223a of the light emitting cells LS1, LS2, LS3 and the like to one another. Accordingly, when the first separated layer 223b and the first upper semiconductor layers 223a are separated from each other, they are electrically connected to each other by the connection metals 233a. The connection metals 233a are spaced apart from sidewalls of the light emitting cells LS1, LS2, LS3 and the like by the first insulating layer 231 and thus insulated from the patterned active layers 225a and the second lower semiconductor layers 227a. The connection metals 233a are also insulated from the connection metal 237 by the second insulating layer 235.

Meanwhile, the intermediate metal 233b is interposed between the connection metal 237 and the second separated layer 223c and connected to the second separated layer 223c. That is, the second separated layer 223c may be electrically connected to the connection metal 237 through the intermediate metal 233b. In the meantime, the intermediate metal 233b is insulated from the upper semiconductor layers 223a by the first insulating layer 231. The intermediate metal 233b and the protective metal layer 233c may be formed together with the connection metals 233a.

The first insulating layer 231 prevents electrical short circuits between the first upper semiconductor layer 223a and the second lower semiconductor layer 227a from being induced by contact of the connection metals 233a, the intermediate metal 233b, and the connection metal 237 with the sidewalls of the light emitting cells LS1, LS2, LS3 and the like. The first insulating layer 231 covers the sides of the light emitting cells LS1, LS2, LS3 and the like, and may extend to partially cover the bottom surfaces of the second lower semiconductor layers 227a. The first insulating layer 231 may also cover edges of the reflective metal layers 229.

The first insulating layer 231 has openings for exposing bottom surfaces of the first separated layer 223b and the second separated layer 223c and also has openings for exposing the extensions of the light emitting cells LS1, LS2, LS3 and the like. The connection metals 233a are connected to the first upper semiconductor layers 223a through the openings of the first insulating layer 231. Meanwhile, the first insulating layer 231 is interposed between the first separated layer 223b and the first upper semiconductor layers 223a and the first insulating layer 231 is also interposed between the second separated layer 223c and the first upper semiconductor layers 223a. The first insulating layer 231 also prevents the connection metals 233a and the intermediate metal 233b from being exposed to the outside. Further, when the first upper semiconductor layers 223a are separated from one another, the first insulating layer 231 is positioned between the first upper semiconductor layers 223a to prevent the connection metals 233a between the light emitting cells LS1, LS2, LS3 and the like to be exposed to the outside.

The second insulating layer 235 is interposed between the connection metals 233a and the connection metal 237 to insulate them from each other. The second insulating layer 235 may cover the first insulating layer 231 that covers the sidewalls of the light emitting cells LS1, LS2, LS3 and the like. In the meantime, the second insulating layer 235 has an opening for exposing the intermediate metal 233b, and thus, the connection metal 237 may be connected to the intermediate metal 233b through the second insulating layer 235. Further, the second insulating layer 235 has openings below the second lower semiconductor layers 227a, and thus, the connection metal 237 may be connected to the second lower semiconductor layers 227a or the reflective metal layers 229 or protective metal layers 233c under the second lower semiconductor layers 227a through the second insulating layer 235.

A material of the first insulating layers 231 and second insulating layers 235 is not particularly limited, but is preferably formed of a transparent insulating material, such as $SiO_2$, SiN, MgO, TaO, $TiO_2$, or polymer.

The first bonding metal 241 and the second bonding metal 243 are interposed between the bonding substrate 251 and the connection metal 237. The first bonding metal 241 and the second bonding metal 243 enhance the adhesion between the connection metal 237 and the bonding substrate 251, thereby preventing the bonding substrate 151 from being separated from the connection metal 237.

Meanwhile, the first electrode pad 245a is formed on the first separated layer 223b, and the second electrode pad 245b is formed on the second separated layer 223c. Like the first electrode pad 245a, the second electrode pad 245b is formed on the second separated layer 223c, so that the adhesion of second electrode pad 245b is enhanced. Also, the first electrode pad 245a and the second electrode pad 245b may be formed of the same metallic material.

Wires (not shown) may be bonded to the first electrode pad 245a and the second electrode pad 245b, and current is supplied to the light emitting cells LS1, LS2, LS3 and the like through the wires so that light is emitted from the patterned active layers 225a of the light emitting cells LS1, LS2, LS3 and the like.

FIG. 16, FIG. 17, FIG. 18, FIG. 19, FIG. 20, FIG. 21, FIG. 22, FIG. 23, FIG. 24, FIG. 25, and FIG. 26 are sectional views illustrating a method of fabricating a light emitting device according to an exemplary embodiment of the present invention.

Figure 16:
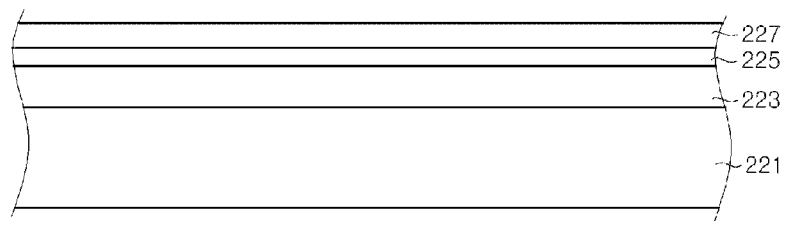
FIG. 16, FIG. 17, FIG. 18, FIG. 19, FIG. 20, FIG. 21, FIG. 22, FIG. 23, FIG. 24, FIG. 25, and FIG. 26 are sectional views illustrating a method of fabricating a light emitting device according to an exemplary embodiment of the present invention.

Referring to FIG. 16, compound semiconductor layers are formed on a sacrificial substrate 221 as described with reference to FIG. 6. The compound semiconductor layers comprise a first semiconductor layer 223, a second semiconductor layer 227, and an active layer 225 interposed therebetween. The first semiconductor layer 223 is positioned close to the sacrificial substrate 221. The sacrificial substrate 221 has first and second electrode pad regions corresponding to the first electrode pad 245a and the second electrode pad 245b of FIG. 14 and also has light emitting cell regions corresponding to light emitting cells LS1, LS2, LS3 and the like.

Figure 17:
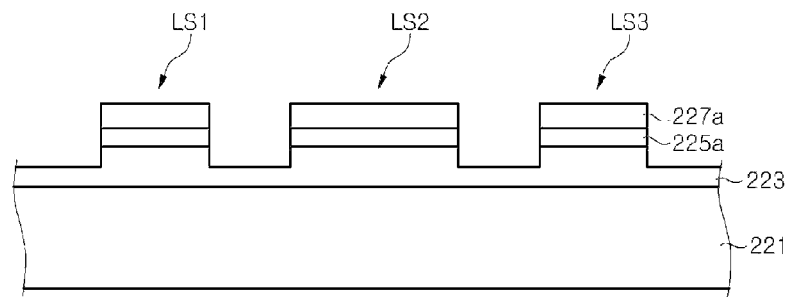

Referring to FIG. 17, a plurality of the light emitting cells LS1, LS2, LS3 and the like are formed by patterning the compound semiconductor layers. Each of the light emitting cells comprises a first semiconductor layer 223, a patterned active layer 225a and a patterned second lower semiconductor layer 227a. The compound semiconductor layers may be patterned using a photolithography process, and such a process is similar to a mesa etching process generally known in the art. At this time, the second semiconductor layer 227 and the active layer 225 around each of the light emitting cells are removed, and the first semiconductor layer 223 is exposed. As shown in this figure, the first semiconductor layer 223 may also be partially etched and removed. As a result, the first semiconductor layer 223, the patterned active layers 225a and the second lower semiconductor layers 227a are exposed at the sides of the light emitting cells LS1, LS2, LS3 and the like. Meanwhile, the active layer 225 and the second semiconductor layer 227 on the first electrode pad and the second electrode pad region are removed, and thus, the first semiconductor layer 223 is exposed in these regions.

Figure 18:
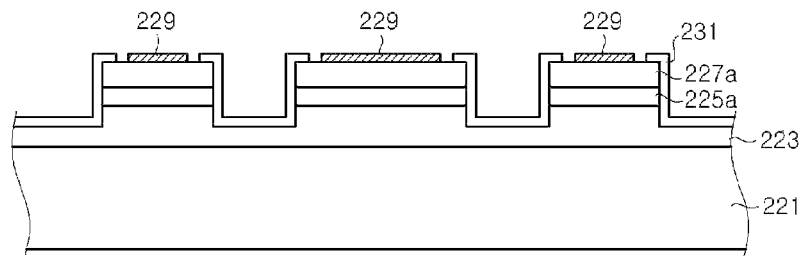

Referring to FIG. 18, reflective metal layers 229 are formed on the light emitting cells LS1, LS2, LS3 and the like, respectively. The reflective metal layers 229 may be formed of Ag, Al, Ag alloy, or Al alloy, for example. The reflective metal layers 229 may be formed using a plating or depositing technique, for example, a lift-off process. Meanwhile, when the reflective metal layer 229 is not in ohmic contact with the second lower semiconductor layer 227a, an ohmic contact layer (not shown) may be formed before the reflective metal layer 229 is formed.

Subsequently, a first insulating layer 231 is formed to cover the light emitting cells LS1, LS2, LS3 and the like and the exposed first semiconductor layer 223. The first insulating layer may be formed of $SiO_2$, SiN, MgO, TaO, $TiO_2$, or polymer, for example. The first insulating layer 231 may cover the first semiconductor layer 223 and the patterned active layers 225a, which are exposed at the sides of the light emitting cells and may also cover the second lower semiconductor layers 227a. The first insulating layer 231 is patterned to have openings for exposing the reflective metal layers 229.

Although it has been described that the reflective metal layer 229 is formed before forming the insulating layer 231, the reflective metal layer 229 may be formed after forming the insulating layer 231.

Figure 19:
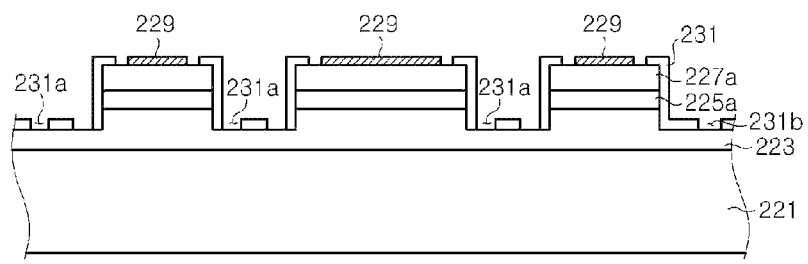

Referring to FIG. 19, the first insulating layer 231 is also patterned to have openings 231a for exposing the first semiconductor layer 223 on the first electrode pad regions and the first semiconductor layer 223 around the light emitting cells LS1, LS2, LS3 and the like. At this time, an opening 231b for exposing the first semiconductor layer 223 on the second electrode pad region may be formed together with the openings 231a. The patterning process may be performed together when forming the openings for exposing the reflective metal layers 229.

The openings 231a may be formed in a pair such that the insulating layer 231 is positioned therebetween. That is, the opening for exposing the first semiconductor layer 223 on the first electrode pad region is formed together with the opening for exposing the first semiconductor layer 223 around the light emitting cell LS1 adjacent thereto. Further, the openings 231a for respectively exposing the first semiconductor layer 223 around the light emitting cells LS1 and LS2 are formed together between the light emitting cells LS1 and LS2. So are the openings 231a between the light emitting cells LS2 and LS3. On the contrary, the opening 231b does not expose the first semiconductor layer 223 around the light emitting cell LS3 adjacent thereto.

Figure 20:
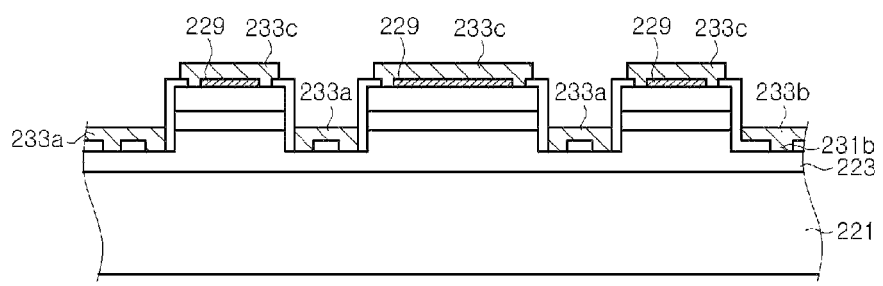

Referring to FIG. 20, thereafter, there are formed connection metals 233a connected to the first semiconductor layer 223 through the openings 231a and an intermediate metal 233b connected to the first semiconductor layer 223 through the opening 231b. At this time, protective metal layers 233c for covering the reflective metal layers 229 may be formed together with the connection metals 233a and the intermediate metal 233b. The connection metals 233a and the intermediate metal 233b are spaced apart from the sides of the light emitting cells LS1, LS2, LS3 and the like by the first insulating layer 231.

The intermediate metal 233b and the protective metal layer 233c may be omitted. Further, when the intermediate metal 233b is omitted, the opening 231b is not necessarily formed together with the openings 231a but may be formed in a subsequent process.

Figure 21:
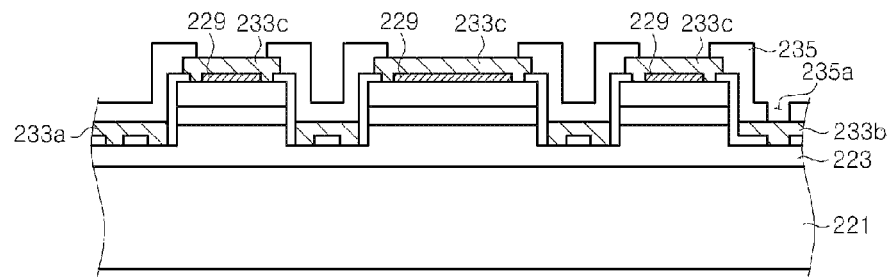

Referring to FIG. 21, a second insulating layer 235 is formed to cover the connection metals 233a. The second insulating layer 235 is deposited on almost the entire surface of the substrate 221, on which the connection metals 233a are formed, thereby covering the light emitting cells LS1, LS2, LS3 and the like and the intermediate metal 233b as well as the connection metals 233a. Then, the second insulating layer 235 is patterned to form openings for exposing the protective metal layers 233c and openings 235a exposing the intermediate metal 233b.

Figure 22:
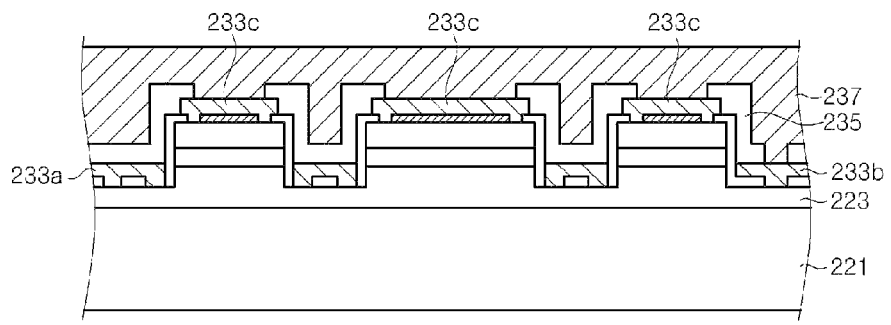

Referring to FIG. 22, a connection metal 237 is formed on the second insulating layer 235. The connection metal 237 may be formed on the entire surface of the substrate 221. The connection metal 237 is connected to the protective metal layers 233c through the openings of the second insulating layer 235. The connection metal 237 is also connected to the intermediate metal 233b through the openings 235a of the second insulating layer 235. The second lower semiconductor layers 227a are electrically connected to one another by the connection metal 237. The connection metal 237 may be formed to have a single- or multi-layered structure. For example, the connection metal 237 may be formed of Ni, Ti, Ta, Pt, W, Cr, Pd, or the like. The connection metal 237 may also comprise a reflective metal layer and/or a protective metal layer. In this case, the process of forming the reflective metal layer 229 and/or the protective metal layer 233c may be omitted.

Figure 23:
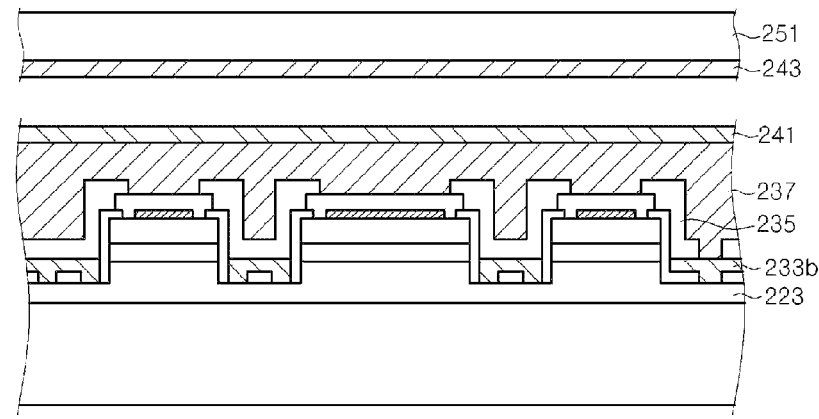

Referring to FIG. 23, a first bonding metal 241 may be formed on the connection metal 237. The bonding metal 241 may be formed, for example, of AuSn (80/20 wt %) to have a thickness of about 15,000 Å. A second bonding metal 243 may be formed on a substrate 251, and the substrate 251 is bonded to the connection metal 237 by bonding the first bonding metal 241 and the second bonding metal 243 to face each other. The substrate 251 is not particularly limited but may be a substrate, e.g., a sapphire substrate, which has a thermal expansion coefficient identical to that of the sacrificial substrate 121.

Figure 24:
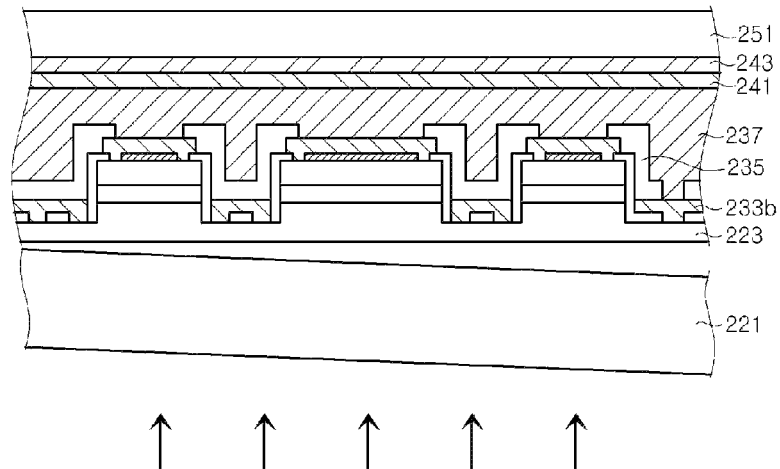

Referring to FIG. 24, the sacrificial substrate 221 is removed, and the first semiconductor layer 223 is exposed.

Figure 25:
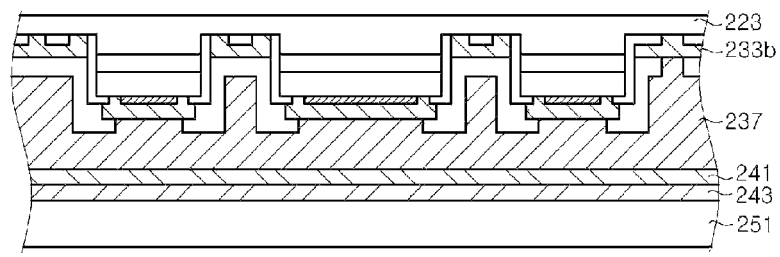

The sacrificial substrate 221 may be separated using a laser lift-off (LLO) technique or other mechanical or chemical methods. At this time, any buffer layer (not shown) is also removed so that the first semiconductor layer 223 is exposed. FIG. 25 shows that the light emitting device is turned over so that the first semiconductor layer 223 faces upward after the sacrificial substrate 221 is removed. For convenience of illustration, the first and second electrode pad regions are shown to be positioned in the same direction as those of FIG. 24.

Figure 26:
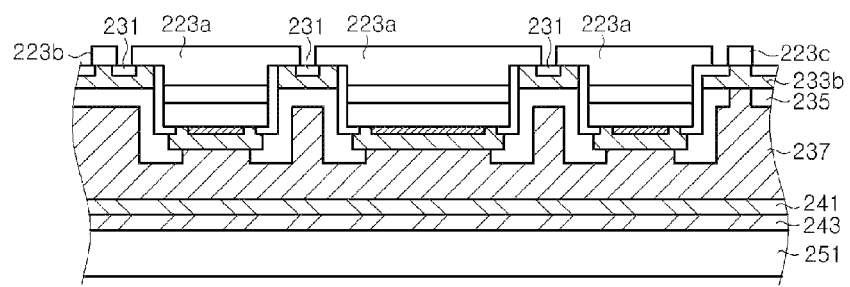

Referring to FIG. 26, the exposed first semiconductor layer 223 is patterned, thereby forming first separated layers 223b on the first and second electrode pad regions and second separated layers 223c on the second electrode pad regions, and forming first upper semiconductor layers 223a separated from one another. At this time, the first insulating layer 231 may be exposed at the positions where the first semiconductor layer 223 is removed. Accordingly, it is possible to prevent the connection metals 233a and the intermediate metal 233b from being exposed to the outside.

Referring back to FIG. 15, a first electrode pad 245a is formed on the first separated layer 223b, and a second electrode pad 245b is formed on the second separated layer 223c. The first electrode pad 245a and the second electrode pad 245b may be formed of the same material. Meanwhile, rough surfaces R may be formed on the first semiconductor layers 223a of the light emitting cells LS1, LS2, LS3 and the like using a photoelectrochemical (PEC) etching process or the like. Thereafter, the substrate is separated into light emitting devices each having a plurality of light emitting cells LS1, LS2, LS3 and the like, and thus, a light emitting device is completed.

Although it has been described in this embodiment that the separated layer 223b is formed on the first electrode pad region, the first semiconductor layer 223 on the first electrode pad region may not be separated from the first semiconductor layer 223 of the light emitting cell LS1. Also, the first upper semiconductor layers 223a of the light emitting cells LS1, LS2, LS3 and the like may not be separated from one another but may be continuous to one another.

According to the present invention, there may be provided a light emitting device, wherein it is possible to prevent metallic etch byproducts from being generated and thus to prevent an electrical short circuit in a light emitting cell, and a method of fabricating the light emitting device. Further, light traveling toward a substrate throughout the entire surface of the substrate can be reflected by employing first and second reflective metal layers, thereby improving a light emitting efficiency of an AC light emitting device. Furthermore, wires are embedded in the light emitting device, thereby preventing loss of light emitted from a light emission surface from occurring due to the wires and electrode pads. In addition, a reflective metal layer is not exposed to the outside during an etching process, thereby preventing the reflective metal layer from being deformed by etching or oxidation.

Furthermore, there may be provided a light emitting device having a plurality of light emitting cells connected in parallel and a method of fabricating the light emitting device. Since a plurality of light emitting cells are employed, uniform current is supplied to each of the light emitting cells to improve a light efficiency thereof, so that the light emitting efficiency of the entire light emitting device can be improved. Particularly, since light emitting efficiency is improved by subdividing light emitting cells, the present invention is suitable for improving the light efficiency of a large area light emitting device in which current spreading is difficult. Further, as reflective metal layers are interposed between lower semiconductor layers and connection metals, the path of light traveling toward a substrate can be reduced, and accordingly, light loss generated in the light emitting device can be reduced. Furthermore, an n-type semiconductor layer capable of being formed relatively thick is used as an upper semiconductor layer, so that a rough surface can be easily formed on a light emission surface.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light-emitting device, comprising:
a substrate;
a first connection metal disposed on the substrate;
light-emitting regions disposed on the first connection metal, each light-emitting region comprising an upper semiconductor layer, a lower semiconductor layer, and an active layer disposed between the upper and lower semiconductor layers;
a second connection metal electrically connecting adjacent light-emitting regions to each other and comprising openings in which the light-emitting regions are disposed;
a bonding metal disposed between the substrate and the first connection metal, the bonding metal being disposed continuously over an entire area below all of the light-emitting regions;
a first insulation layer disposed on the second connection metal, surrounding the light emitting regions, and comprising openings in which the light-emitting regions are disposed; and
a second insulation layer disposed between the first connection metal and the second connection metal,
wherein the light-emitting regions are connected in parallel by the first connection metal and the second connection metal.

2. The light-emitting device of claim 1, wherein the first connection metal and the second connection metal are stacked vertically between the light-emitting regions and the substrate.

3. The light-emitting device of claim 1, wherein the first insulation layer is disposed between side surfaces of the light-emitting regions and the first and second connection metals.

4. The light-emitting device of claim 1, wherein the upper semiconductor layers each comprise an extension that overlaps the second connection metal.

5. The light-emitting device of claim 4, wherein in each light-emitting region, the perimeter of the upper surface of the upper semiconductor layer is longer than the perimeter of the active layer.

6. The light-emitting device of claim 1, wherein:
each upper semiconductor layer has an upper surface and an opposing contact surface; and
the second connection metal directly contacts the contact surfaces.

7. The light-emitting device of claim 1, wherein the first and second connection metals are not exposed to the outside of the light-emitting device.

8. The light-emitting device of claim 1, wherein the first connection metal comprises protrusions that extend between the light-emitting regions.

9. The light-emitting device of claim 1, further comprising a reflective metal layer disposed between the lower semiconductor layer and the substrate and in contact with the lower semiconductor layer.

10. The light-emitting device of claim 1, wherein the upper surface of each upper semiconductor layer is processed or roughened so as to increase the light extraction efficiency of the light-emitting regions.

11. A light-emitting device, comprising:
   a substrate;
   a first connection metal disposed on the substrate;
   light-emitting regions disposed on the first connection metal;
   a second connection metal electrically connecting adjacent light-emitting regions, and comprising openings in which the light-emitting regions are disposed;
   a first insulation layer disposed between the first and second connection metals;
   a bonding metal disposed between the substrate and the first connection metal, the bonding metal being disposed continuously over an entire area below all of the light-emitting regions; and
   a second insulation layer disposed on the second connection metal, surrounding the light emitting regions, and comprising openings in which the light-emitting regions are disposed,
   wherein the light-emitting regions are connected in parallel by the first and second connection metals.

12. The light-emitting device of claim 11, wherein each light-emitting region comprises an upper semiconductor layer, a lower semiconductor layer, an active layer disposed between the upper and lower semiconductor layers, and a reflective metal layer disposed between the lower semiconductor layer and the substrate, the reflective metal layer contacting the lower semiconductor layer.

13. The light-emitting device of claim 12, wherein each upper semiconductor layer comprises an extension that overlaps and directly contacts the second connection metal.

14. The light-emitting device of claim 12, wherein the upper semiconductor layer comprises an N-type dopant.

15. The light-emitting device of claim 11, further comprising:
   a first electrode electrically connected to the first connection metal; and
   a second electrode electrically connected to the second connection metal,
   wherein the first electrode and the second electrode are disposed at a substantially equal height on the same side of the substrate.

* * * * *